(12) United States Patent
Matsushima et al.

(10) Patent No.: US 10,138,166 B2
(45) Date of Patent: Nov. 27, 2018

(54) ALUMINA SINTERED BODY AND BASE SUBSTRATE FOR OPTICAL DEVICE

(71) Applicant: NGK INSULATORS, LTD., Nagoya (JP)

(72) Inventors: Kiyoshi Matsushima, Nagoya (JP); Morimichi Watanabe, Nagoya (JP); Kei Sato, Tokai (JP); Tsutomu Nanataki, Toyoake (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 15/447,670

(22) Filed: Mar. 2, 2017

(65) Prior Publication Data

US 2017/0174574 A1    Jun. 22, 2017

Related U.S. Application Data

(63) Continuation of application No. PCT/JP2015/082644, filed on Nov. 20, 2015.

(30) Foreign Application Priority Data

Nov. 28, 2014  (JP) ................................. 2014-241683

(51) Int. Cl.
  *C04B 35/115*  (2006.01)
  *G02B 1/00*  (2006.01)
  (Continued)

(52) U.S. Cl.
  CPC .............. *C04B 35/115* (2013.01); *C01F 7/02* (2013.01); *C01F 7/30* (2013.01); *C01F 7/441* (2013.01);
  (Continued)

(58) Field of Classification Search
  CPC . C04B 35/115; C04B 35/6342; C04B 35/632; C04B 35/6303; C04B 35/638;
  (Continued)

(56) References Cited

U.S. PATENT DOCUMENTS 5,854,159 A     12/1998  Kato
2003/0125189 A1  7/2003  Castro et al.
(Continued)

FOREIGN PATENT DOCUMENTS

EP    1727178 A2 * 11/2006 ............. B82Y 30/00
JP    51-30209 A1    3/1976
(Continued)

OTHER PUBLICATIONS

English translation of International Preliminary Report on Patentability (Application No. PCT/JP2015/082644) dated Jun. 8, 2017.
(Continued)

*Primary Examiner* — James A Fiorito
(74) *Attorney, Agent, or Firm* — Burr & Brown, PLLC

(57) ABSTRACT

An alumina sintered body according to the present invention has a degree of c-plane orientation of 90% or more as determined by Lotgering's method from an X-ray diffraction profile obtained by irradiating a plate surface with X-rays in a range of 2θ=20° to 70°. The alumina sintered body has no pores when a cross-sectional surface formed in a direction perpendicular to the plate surface is polished using an Ar$^+$ ion beam and a mask and is examined under a scanning electron microscope at a magnification of 5,000 times. The alumina sintered body has a total mass fraction of impurity elements other than Mg and C of 100 ppm or less. This alumina sintered body has a high degree of orientation, high density, and high purity and thus has a higher optical translucency than those known in the art.

6 Claims, 7 Drawing Sheets

(51) Int. Cl.
| | |
|---|---|
| C01F 7/02 | (2006.01) |
| C01F 7/30 | (2006.01) |
| C04B 35/63 | (2006.01) |
| C04B 35/632 | (2006.01) |
| C04B 35/634 | (2006.01) |
| C04B 35/638 | (2006.01) |
| C04B 35/645 | (2006.01) |
| C30B 1/04 | (2006.01) |
| C30B 1/10 | (2006.01) |
| C30B 29/20 | (2006.01) |
| C01F 7/44 | (2006.01) |
| C04B 35/626 | (2006.01) |
| H01L 33/28 | (2010.01) |
| H01L 33/32 | (2010.01) |

(52) U.S. Cl.
CPC .......... *C01F 7/442* (2013.01); *C04B 35/6268* (2013.01); *C04B 35/632* (2013.01); *C04B 35/6303* (2013.01); *C04B 35/638* (2013.01); *C04B 35/6342* (2013.01); *C04B 35/645* (2013.01); *C04B 35/6455* (2013.01); *C30B 1/04* (2013.01); *C30B 1/10* (2013.01); *C30B 29/20* (2013.01); *G02B 1/00* (2013.01); *C01P 2002/72* (2013.01); *C01P 2004/20* (2013.01); *C01P 2004/54* (2013.01); *C01P 2004/61* (2013.01); *C01P 2006/80* (2013.01); *C04B 2235/322* (2013.01); *C04B 2235/3206* (2013.01); *C04B 2235/3208* (2013.01); *C04B 2235/3217* (2013.01); *C04B 2235/3418* (2013.01); *C04B 2235/425* (2013.01); *C04B 2235/445* (2013.01); *C04B 2235/5292* (2013.01); *C04B 2235/5296* (2013.01); *C04B 2235/5436* (2013.01); *C04B 2235/5445* (2013.01); *C04B 2235/604* (2013.01); *C04B 2235/6025* (2013.01); *C04B 2235/612* (2013.01); *C04B 2235/656* (2013.01); *C04B 2235/6567* (2013.01); *C04B 2235/72* (2013.01); *C04B 2235/721* (2013.01); *C04B 2235/725* (2013.01); *C04B 2235/77* (2013.01); *C04B 2235/787* (2013.01); *C04B 2235/9653* (2013.01); *C04B 2235/9692* (2013.01); *H01L 33/28* (2013.01); *H01L 33/32* (2013.01)

(58) Field of Classification Search
CPC .......... C04B 35/6455; C04F 7/02; C04F 7/30; C30B 1/04; C30B 29/20; C30B 1/10
See application file for complete search history.

(56) References Cited

U.S. PATENT DOCUMENTS

| | | | |
|---|---|---|---|
| 2008/0266745 | A1* | 10/2008 | Nobori ................ H01L 21/6831 361/234 |
| 2011/0039685 | A1* | 2/2011 | Mao ...................... C04B 35/115 501/153 |

FOREIGN PATENT DOCUMENTS

| | | |
|---|---|---|
| JP | 07-315915 A1 | 12/1995 |
| JP | 09-263440 A1 | 10/1997 |
| JP | 2916664 B2 | 7/1999 |
| JP | 2004-359495 A1 | 12/2004 |
| JP | 2005-514305 A1 | 5/2005 |

OTHER PUBLICATIONS

Xiaojian Mao, et al., "Transparent Polycrystalline Alumina Ceramics with Orientated Optical Axes," *Journal of American Ceramic Society*, vol. 91, No. 10, 2008, pp. 3431-3433.
International Search Report and Written Opinion (Application No. PCT/JP2015/082644) dated Feb. 16, 2016.

* cited by examiner

ALUMINA SINTERED BODY AND BASE SUBSTRATE FOR OPTICAL DEVICE

BACKGROUND OF THE INVENTION

1. Field of the Invention

The present invention relates to alumina sintered bodies and base substrates for optical devices.

2. Description of the Related Art

Sintered polycrystalline alumina ($Al_2O_3$) bodies have been widely used as materials with good mechanical strength, insulation, thermal shock resistance, and corrosion resistance. Sintered polycrystalline alumina bodies are known to exhibit improved mechanical strength, thermal shock resistance, and corrosion resistance when the crystal orientations of the constituent grains are aligned in a particular direction (i.e., oriented) by controlling the microstructure. This is because such alumina sintered bodies show anisotropy in fracture toughness, dielectric constant, thermal conductivity, and thermal expansion coefficient resulting from the crystal orientation. For example, PTL 1 discloses that an oriented alumina sintered body prepared using a plate-like alumina powder as one ingredient has good heat resistance and corrosion resistance. In PTL 1, a compact prepared using a plate-like alumina powder as one ingredient is fired; however, the resulting compact will not be sufficiently oriented since the alumina purity is low, i.e., less than 99.9% by mass, and the compact is fired at low temperature, i.e., 1,500° C. to 1,750° C., by pressureless sintering. In addition, the resulting oriented alumina sintered body will not be transparent since PTL 1 does not mention optical translucency.

High-density sintered polycrystalline alumina bodies are known to be optical translucent at reduced impurity concentrations and are used for applications such as high-pressure sodium lamp tubes, high-heat-resistance window materials, components for semiconductor devices, and substrates for optical components. Although several attempts have been made to improve the optical translucency of optical translucent alumina sintered bodies, including controlling the crystal grain size and reducing pores and impurity concentration, sufficient optical translucency has yet to be achieved. One possible cause is birefringence resulting from the crystal structure. Alumina sintered bodies are known to have optical anisotropy resulting from the crystal structure and exhibit limited optical translucency if the polycrystalline alumina has a low degree of orientation. For example, in NPL 1, an oriented sintered polycrystalline alumina compact is prepared by a combination of slip casting and magnetic orientation to achieve improved optical transparency.

CITATION LIST

Patent Literature

PTL 1: Japanese Patent No. 2916664

Non-Patent Literature

NPL 1: Journal of American Ceramic Society, 91 [10], pp. 3431-3433 (2008)

SUMMARY OF THE INVENTION

However, the optical translucent alumina sintered body in NPL 1 has an in-line transmittance (although NPL 1 recites "in-line transmission", "in-line transmittance" should be correct) of only about 50% to 60% at 350 to 1,000 nm. Accordingly, the development of an alumina sintered body having a higher optical translucency has been desired.

The present invention has been made to solve the foregoing problem. A primary object of the present invention is to provide an alumina sintered body having a higher optical translucency than those known in the art.

An alumina sintered body according to the present invention has a surface with a degree of c-plane orientation of 90% or more as determined by Lotgering's method from an X-ray diffraction profile obtained by X-ray irradiation in a range of 2θ=20° to 70°. The alumina sintered body has no pores when any cross-sectional surface is polished by ion milling and is examined under a scanning electron microscope at a magnification of 5,000 times. The alumina sintered body has a total mass fraction of impurity elements other than Mg and C of 100 ppm or less. This alumina sintered body has a high degree of orientation since it has a degree of c-plane orientation of 90% or more, has high density since it has no pores, and has high purity since it has a total mass fraction of impurity elements other than Mg and C of 100 ppm or less. Thus, the alumina sintered body according to the present invention has a higher optical transparency than those known in the art.

A base substrate for an optical device according to the present invention is a substrate comprising the above alumina sintered body according to the present invention. Examples of optical devices include LEDs, LDs, solar cells, sensors, photodiodes, optical components, and window materials.

DETAILED DESCRIPTION OF THE INVENTION

Figure 1:
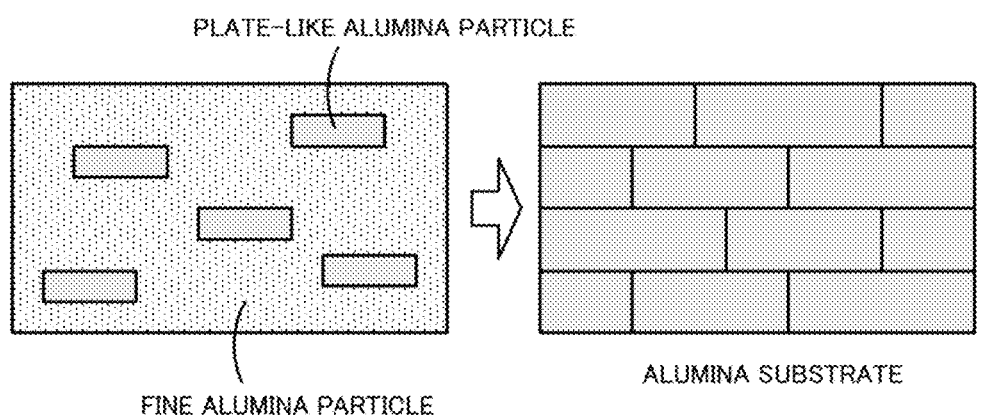
FIG. 1 is a schematic illustration of the process of preparing an alumina sintered body by TG.

An alumina sintered body according to the present invention has a surface with a degree of c-plane orientation of 90% or more as determined by Lotgering's method from an X-ray diffraction profile obtained by X-ray irradiation in a range of 2θ=20° to 70°. The alumina sintered body has no pores when any cross-sectional surface is polished by ion milling and is examined under a scanning electron microscope at a magnification of 5,000 times. The alumina sintered body has a total mass fraction of impurity elements other than Mg and C of 100 ppm or less. In the present invention, the total mass fraction of impurity elements is determined as the total quantitative value of those elements determined by inductively coupled plasma (ICP) emission spectroscopy, firing (high-frequency heating)-infrared absorption spectroscopy, inert gas fusion-thermal conductivity method, inert gas fusion-nondispersive infrared absorption spectroscopy, and pyrohydrolysis-ion chromatography, described later.

The degree of c-plane orientation is calculated by the following equation from an X-ray diffraction profile obtained by smoothly polishing a predetermined cross-sectional surface (e.g., a cross-sectional surface parallel to the c-plane) of the alumina sintered body and irradiating that surface with X-rays in a range of 2θ=20° to 70° using an XRD system (e.g., RINT-TTR III available from Rigaku Corporation). In the equation, P is a value obtained from the alumina sintered body by XRD, and $P_0$ is a value obtained from an α-alumina standard (JCPDS Card No. 46-1212). The c-plane is the (006) plane of alumina. The alumina sintered body according to the present invention is a highly oriented alumina sintered body having a degree of c-plane orientation of 90% or more.

$$\text{Degree of } c\text{-Plane Orientation}[\%] = \frac{p - p_0}{1 - p_0} \times 100 \quad [\text{Math. 1}]$$

$$p_0 = \frac{I_0(006)}{\sum I_0(hkl)}$$

$$p = \frac{I_s(006)}{\sum I_s(hkl)}$$

Pores are counted as follows. Specifically, any cross-sectional surface of the alumina sintered body according to the present invention is polished by ion milling and is examined under a scanning electron microscope at a magnification of 5,000 times to count pores. For example, vertically 6 photographs×horizontally 5 photographs, i.e., 30 photographs, of a polished cross-sectional surface with a field of view of vertically 19.0 µm×horizontally 25.4 µm are captured under a scanning electron microscope at a magnification of 5,000 times to obtain a continuous photograph (vertically 114 µm×horizontally 127 µm). These 30 photographs are visually inspected to count pores. Ion milling is employed for polishing since it produces no particles detached from the cross-sectional surface. An example polishing system that employs ion milling is a cross-section polisher available from JEOL Ltd. Pores appear as black dots and are thus sufficiently visible in photographs at a magnification of 5,000 times. Since the alumina sintered body according to the present invention has no pores, it is a high-density alumina sintered body.

The contents of impurity elements (i.e., those other than Mg and C) can be determined by ICP emission spectroscopy, firing (high-frequency heating)-infrared absorption spectroscopy, pyrohydrolysis-ion chromatography, inert gas fusion-thermal conductivity method, or inert gas fusion-nondispersive infrared absorption spectroscopy, depending on the element. For example, the content of S can be determined by firing (high-frequency heating)-infrared absorption spectroscopy. The content of N can be determined by inert gas fusion-thermal conductivity method. The content of H can be determined by inert gas fusion-nondispersive infrared absorption spectroscopy. The content of F can be determined by pyrohydrolysis-ion chromatography.

The contents of other elements can be determined by ICP emission spectroscopy. Since the alumina sintered body according to the present invention has a total mass fraction of impurity elements other than Mg and C of 100 ppm or less, it is a high-purity alumina sintered body. Preferably, the alumina sintered body according to the present invention has a total mass fraction of impurity elements of 50 ppm or less, more preferably 10 ppm or less.

The alumina sintered body according to the present invention preferably contains 30 to 70 ppm by mass of C. The content of C can be determined by firing (high-frequency heating)-infrared absorption spectroscopy. This significantly reduces the frequency at which alumina particles are detached from the surface of the alumina sintered body as the surface is polished with an abrasive to eliminate surface irregularities. For example, if a film of a compound used for optical devices, such as GaN, is formed on the polished surface of the alumina sintered body, the resulting film has few defects since there are few surface irregularities due to particle detachment.

The alumina sintered body according to the present invention preferably has an alumina content of 99.9% by mass or more. For the sake of convenience, the purity of alumina is calculated by determining the sum of the mass percentages of impurity elements (including Mg and C) in the alumina sintered body, X, and subtracting X from 100.

It is preferred that a 0.2 mm thick specimen removed from the alumina sintered body according to the present invention have an in-line transmittance of 70% or more at wavelengths of 350 to 1,000 nm. Such highly optical translucent alumina sintered bodies are not known in the art and are therefore expected to find applications in a variety of fields. In-line transmittance can be determined using a spectrophotometer (e.g., Lambda 900 available from Perkin Elmer Inc.).

The alumina sintered body according to the present invention may contain 1,300 ppm or less (preferably, 1,150 ppm or less, more preferably 450 ppm or less, even more preferably 120 ppm or less) by mass of Mg. This is because a light-emitting device, such as an LED, fabricated from such an alumina sintered body is not substantially affected by the presence of Mg. It is preferred, however, that the alumina sintered body contain 125 ppm or less by mass of Mg for reasons of corrosion resistance to Na fluxes. Na fluxes are used, for example, to form a film of a compound such as GaN, AlN, or InN on the alumina sintered body according to the present invention by the flux method. During the preparation of the alumina sintered body according to the present invention, which involves sintering alumina by firing, the addition of MgO to alumina before sintering allows it to have a higher density due to the pore-eliminating effect of MgO during sintering. Accordingly, it is preferred to add MgO to a powder mixture before sintering so that the content of Mg in the alumina sintered body falls within the range of mass fraction described above.

The alumina sintered body according to the present invention is preferably not corroded by a Na flux used when a compound such as GaN is deposited on the alumina sintered body by the Na flux method. The degree of corrosion of the alumina sintered body by a flux can be evaluated by the following procedure. A value is obtained by subtracting the minimum in-line transmittance at wavelengths of 350 to 1,000 nm of a 0.2 mm thick specimen removed from the alumina sintered body after immersion in a Na flux at 870° C. under nitrogen for 120 hours from the minimum in-line transmittance at wavelengths of 350 to 1,000 nm of the 0.2 mm thick specimen removed from the alumina sintered body before the immersion in the Na flux. If the value is 5% or less, it can be determined that the alumina sintered body is resistant to corrosion by the flux. In other words, an alumina sintered body having a value of 5% or less is preferred.

The alumina sintered body according to the present invention can be used as a base substrate on which a film is to be formed. For example, the alumina sintered body according to the present invention can be used as a base substrate on which a compound such as GaN, ZnO, AlN, SiC, or InN is to be deposited. Preferably, the surface of the alumina sintered body according to the present invention is mechanically polished before deposition. This eliminates surface irregularities and thus facilitates film deposition with few defects. During mechanical polishing, hard particles (e.g., alumina particles) may be detached from the surface. In view of this, it is preferred that the alumina sintered body according to the present invention contains 30 to 70 ppm by mass of C. This significantly reduces the frequency of particle detachment during mechanical polishing.

The alumina sintered body according to the present invention can be manufactured, for example, by forming and firing a mixture of a plate-like alumina powder and a fine alumina powder having a smaller average particle size than the plate-like alumina powder. The use of a mixture of a plate-like alumina powder and a fine alumina powder facilitates the orientation of plate-like particles during forming (e.g., tape casting, extrusion molding, casting, injection molding, or uniaxial press-forming). During firing, the plate-like alumina powder, which serves as seed crystals (templates), grow homoepitaxially while absorbing the fine alumina powder, which serves as a matrix. This process is known as templated grain growth (TGG). FIG. 1 is a schematic illustration of the process of preparing an alumina sintered body by TGG. TGG allows the control of the microstructure of the resulting alumina sintered body depending on the particle sizes and mixing ratio of the plate-like alumina powder and the fine alumina powder and thus provides a higher density and a higher degree of orientation than firing the plate-like alumina powder alone.

In TGG, the powder mixture is fired while being pressed (e.g., hot-press firing or HIP firing). The powder mixture may be fired while being pressed after pressureless presintering. Encapsulation may also be used in HIP firing. The firing temperature is preferably 1,750° C. to 2,000° C. The pressure for hot-press firing is preferably 50 kgf/cm$^2$ or more, more preferably 200 kgf/cm$^2$ or more. The pressure for HIP firing is preferably 1,000 kgf/cm$^2$ or more, more preferably 2,000 kgf/cm$^2$ or more. Although the content of the plate-like alumina powder in the powder mixture is not limited and may be 100% by mass, it is preferably 0.1% to 50% by mass. If the content of the plate-like alumina powder falls below 0.1% by mass, the resulting alumina sintered body tends to have a low degree of c-plane orientation. If the content of the plate-like alumina powder exceeds 50% by mass, the alumina may resist sintering. More preferably, the content of the plate-like alumina powder is 0.1% to 15% by mass, even more preferably 0.5% to 5% by mass, still more preferably 1.5% to 5% by mass. This results in a sufficiently high degree of c-plane orientation and is also advantageous in terms of cost since the amount of plate-like alumina used, which is expensive, is relatively small. To achieve a higher density, an appropriate amount of sintering aid may be added to the powder mixture. The sintering aid may be at least one compound selected from compounds such as oxides such as MgO, $ZrO_2$, $Y_2O_3$, CaO, $SiO_2$, $TiO_2$, $Fe_2O_3$, $Mn_2O_3$, and $La_2O_3$ and fluorides such as $AlF_3$, $MgF_2$, and $YbF_3$. Among these, MgO, CaO, $SiO_2$, and $La_2O_3$ are preferred, and MgO is particularly preferred. To provide an alumina sintered body having a higher degree of orientation, it is preferred that the particles that form the plate-like alumina powder have a thickness larger than the average particle size of the fine alumina powder. To achieve a higher degree of orientation, it is also preferred that the plate surface of the plate-like particles that form the plate-like alumina powder have a larger particle size, i.e., 1.5 μm or more, more preferably 5 μm or more, even more preferably 10 μm or more, still more preferably 15 μm or more. To achieve a higher density, however, it is preferred that the plate surface have a smaller particle size, i.e., 30 μm or less. Accordingly, to achieve both a higher degree of orientation and a higher density, it is preferred that the plate surface have a particle size of 1.5 to 20 μm.

The plate-like alumina powder preferably has high purity. The purity of the plate-like alumina powder is preferably 99% by mass or more, more preferably 99.9% by mass or more, even more preferably 99.99% by mass or more. The plate-like alumina powder, however, may contain volatile impurity elements that disappear during firing. For example, the plate-like alumina powder may contain elements such as F and S. A high-purity plate-like alumina powder can be manufactured by the following procedure. Specifically, at least one transition alumina powder selected from the group consisting of gibbsite, boehmite, and γ-alumina and an $AlF_3$ powder are first mixed such that the $AlF_3$ content is 0.25% by mass or more to obtain a powder mixture having a total mass fraction of impurity elements other than F, H, C, and S of 1,000 ppm or less. Preferably, α-alumina particles are added as seed crystals to the powder mixture. A vessel is then provided that has such a volume that the mass of $AlF_3$ contained in the powder mixture divided by the volume of the vessel (=$AlF_3$ mass/vessel volume) is 1×10$^{-4}$ g/cm$^3$ or more. The vessel preferably has a total content of elements other than Al, O, Mg, N, and Re (Re: rare-earth element) of 1% by mass or less. The material for the vessel is preferably $Al_2O_3$ having a purity of 99.5% by mass or more. The powder mixture is placed in the vessel and covered with a lid, is placed in the vessel and sealed therein, or is sealed in a vessel made of a porous material. The powder mixture is heated at 750° C. to 1,650° C. to obtain a plate-like alumina powder composed of plate-like α-alumina particles. A mixture of the resulting plate-like alumina powder and the fine alumina powder may be formed and fired to obtain an alumina sintered body. Alternatively, a mixture of a plate-like alumina powder annealed at 900° C. to 1,350° C. in an air, inert, or vacuum atmosphere and the fine alumina powder may be formed and fired to obtain an alumina sintered body. The plate-like alumina powder may be pulverized before being mixed with the fine alumina powder.

A base substrate for an optical device according to the present invention is a substrate comprising the above alumina sintered body according to the present invention. Examples of optical devices include light-emitting devices and light-sensitive devices. For example, a GaN layer may be deposited on the base substrate for an optical device according to the present invention to provide a light-emitting substrate, such as an LED, that is larger and less expensive than a light-emitting substrate fabricated using sapphire as a base substrate. The base substrate for an optical device according to the present invention allows the formation of a dense GaN layer since it comprises alumina with a high degree of orientation. Layers other than GaN layers can also be formed, including ZnO, AlN, and InN layers.

Figure 2:
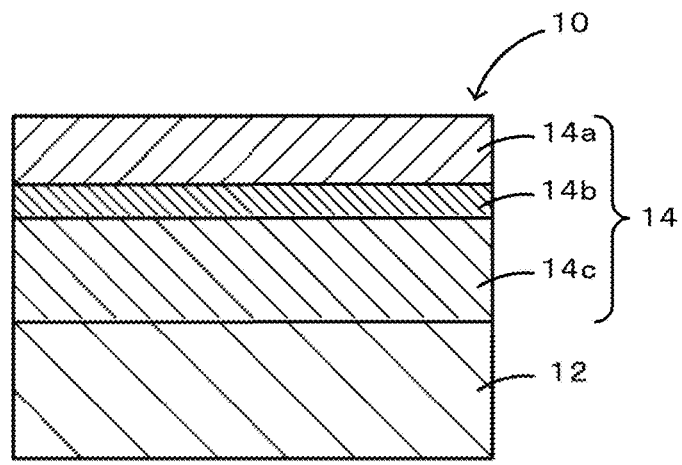
FIG. 2 is a schematic sectional view of a light-emitting device 10.

Example applications of the base substrate for an optical device according to the present invention to light-emitting devices are illustrated below. As shown in FIG. 2, a light-emitting device 10 includes a base substrate 12 and a light-emitting functional layer 14 formed on the base substrate 12. As a voltage is applied to the light-emitting functional layer 14, it emits light based on the light emission mechanism of LEDs. The light-emitting functional layer 14 includes, in sequence from near the base substrate 12, an n-type layer 14c, an active layer 14b, and a p-type layer 14a. The light-emitting functional layer 14 is formed from materials such as GaN-based materials, ZnO-based materials, and AlN-based materials.

Figure 3:
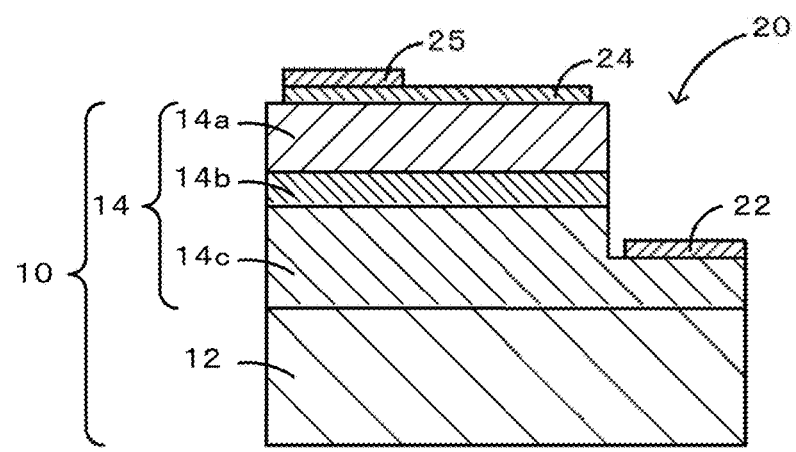
FIG. 3 is a schematic sectional view of a horizontal light-emitting device 20.

As shown in FIG. 3, a horizontal light-emitting device 20 has a step defined by a surface of the n-type layer 14c on the outer periphery of the light-emitting functional layer 14 of the light-emitting device 10. The horizontal light-emitting device 20 includes a cathode 22 disposed on the step of the n-type layer 14c, an anode pad 25 disposed on a surface of the p-type layer 14a through an optical translucent anode 24. This horizontal light-emitting device 20 allows a current to flow not only in the direction normal to the light-emitting functional layer 14, but also in the horizontal direction.

Figure 4:
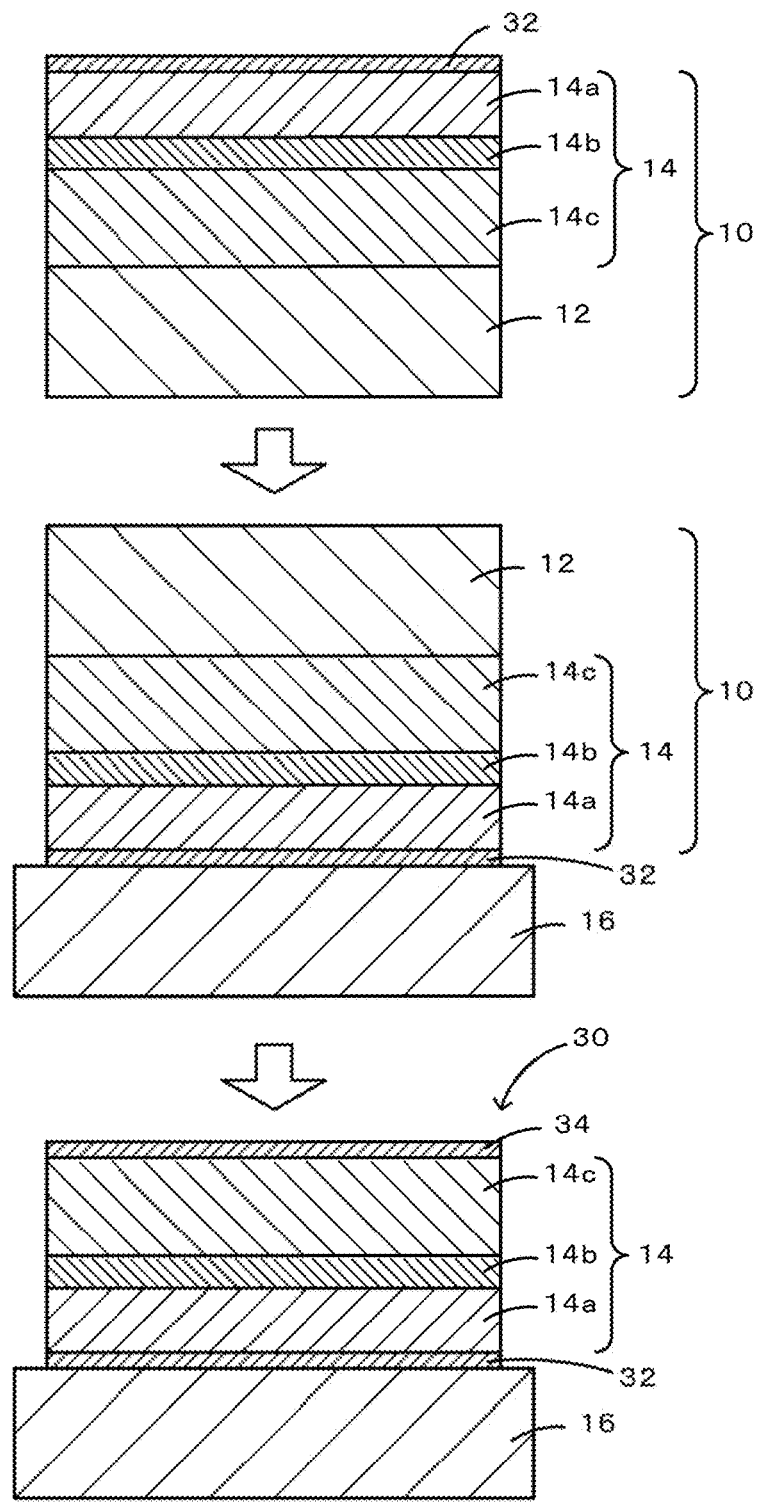
FIG. 4 shows schematic sectional views illustrating a process of manufacturing a vertical light-emitting device 30.

As shown in FIG. 4, a vertical light-emitting device 30 includes a cathode 34 disposed on a surface of the n-type layer 14c of the light-emitting functional layer 14, and a mounting substrate 16 disposed on a surface of the p-type layer 14a through an anode 32. This vertical light-emitting device 30 is fabricated by forming the anode 32 on the surface of the p-type layer 14a of the light-emitting device 10, bonding the anode 32 to the mounting substrate 16, removing the base substrate 12 by laser lift-off, and forming the cathode 34 on the exposed surface of the n-type layer 14c. This vertical light-emitting device 30 allows a current to flow in the direction normal to the light-emitting functional layer 14. Laser lift-off can be employed since the base substrate 12 has a high in-line transmittance and thus has high optical transparency.

EXAMPLES

Experimental Example 1

Figure 6A:
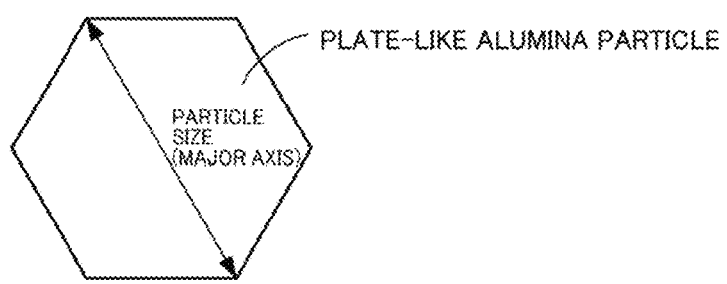
FIGS. 6A and 6B show schematic views of a plate-like alumina particle, including 6A: a plan view and 6B: a front view.
Figure 6B:
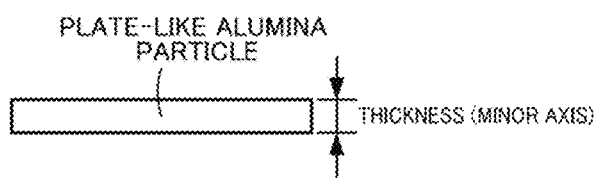

1. Fabrication of Alumina Sintered Body (1) Fabrication of Plate-Like Alumina Powder In a pot mill, 96 parts by mass of a high-purity γ-alumina powder (TM-300D, Taimei Chemicals Co., Ltd.), 4 parts by mass of a high-purity $AlF_3$ powder (Kanto Chemical Co., Inc., Cica Reagent), and 0.17 part by mass of a high-purity α-alumina powder (TM-DAR, Taimei Chemicals Co., Ltd., D50=1 μm), serving as seed crystals, were mixed with alumina balls having a diameter of 2 mm using isopropyl alcohol (IPA) as a solvent for 5 hours. The resulting powder mixture had a total mass fraction of impurity elements other than F, H, C, and S of 1,000 ppm or less. In a high-purity alumina sagger (with a capacity of 750 cm³) having a purity of 99.5% by mass was placed 300 g of the resulting powder mixture. The sagger was covered with a high-purity alumina lid having a purity of 99.5% by mass. The powder mixture was heated in an electric furnace at 900° C. in an air flow for 3 hours. The air flow rate was 25,000 cc/min. The heated powder was annealed at 1,150° C. in air for 40 hours and was then pulverized with alumina balls having a diameter of 2 mm for 4 hours to obtain a plate-like alumina powder having an average particle size of 2 μm, a thickness of 0.2 μm, and an aspect ratio of 10. The average particle size, average thickness, and aspect ratio of the particles were determined by examining randomly selected 100 particles of the plate-like alumina powder under a scanning electron microscope (SEM). The average particle size was determined as the average major axis of the plate surfaces of the particles. The average thickness was determined as the average minor axis (thickness) of the particles. The aspect ratio was determined as the average particle size divided by the average thickness. FIGS. 6A and 6B show schematic views of a plate-like alumina particle, including (a) a plan view and (b) a front view. The plate-like alumina particles are substantially hexagonal in plan view. The particle size is as illustrated in FIG. 6A, whereas the thickness is as illustrated in FIG. 6B. The resulting plate-like alumina powder was made of α-alumina and contained 10 ppm or less of impurity elements other than F, C, and S. The mass fraction of F present in the plate-like alumina powder was determined to be 24 ppm by pyrohydrolysis-ion chromatography. The mass fractions of C and S were determined to be 240 ppm and below the detection limit, respectively, by firing (high-frequency heating)-infrared absorption spectroscopy. The purity of the plate-like alumina powder was 99.97% by mass.

(2) Tape Casting

A mixture was prepared from 5 parts by mass of the plate-like alumina powder prepared in (1) above and 95 parts by mass of a fine alumina powder (TM-DAR, average particle size: 0.1 μm, Taimei Chemicals Co., Ltd.). To 100 parts by mass of the alumina powder mixture, 0.025 part by mass of magnesium oxide (500A, Ube Material Industries, Ltd.), 0.01 part by mass of a graphite powder (UF-G5, Showa Denko K.K.), 7.8 parts by mass of polyvinyl butyral (Product No. BM-2, Sekisui Chemical Co., Ltd.), serving as a binder, 3.9 parts by mass of di(2-ethylhexyl) phthalate (Kurogane Kasei Co., Ltd.), serving as a plasticizer, 2 parts by mass of sorbitan trioleate (RHEODOL SP-030, Kao Corporation), serving as a dispersant, and 2-ethylhexanol, serving as a dispersion medium, were added and mixed. The amount of dispersion medium was adjusted so that the slurry viscosity was 20,000 cP. The thus-prepared slurry was cast into a sheet on a PET film with a doctor blade so that the dry thickness was 20 μm. The resulting tape was cut into circles having a diameter of 50.8 mm (2 inches), and 150 circles were stacked on top of each other. The stacked circles were placed on an Al plate having a thickness of 10 mm and were vacuum-packed by placing them in a package and evacuating the package. The vacuum package was hydrostatically pressed in warm water at 85° C. under a pressure of 100 kgf/cm² to obtain a circular compact.

(3) Firing

Figure 5:
FIG. 5 is a photograph showing the appearance of a sample alumina sintered body.

The resulting compact was placed in a degreasing furnace and was degreased at 600° C. for 10 hours. The resulting degreased compact was placed in a graphite mold and was fired under nitrogen in a hot press at 1,800° C. under a contact pressure of 200 kgf/cm² for 4 hours to obtain an alumina sintered body. FIG. 5 is a photograph showing the appearance of the resulting sample alumina sintered body. The mark incorporating the NGK logo shown in FIG. 5 is a registered trademark of NGK Insulators, Ltd.

2. Properties of Alumina Sintered Body (1) Calculation of Degree of c-Plane Orientation To examine the degree of orientation of the resulting alumina sintered body, the degree of c-plane orientation was determined by XRD. After the top surface of the circular alumina sintered body was polished into a parallel surface, the polished surface was irradiated with X-rays using an XRD system (RINT-TTR III available from Rigaku Corporation) to obtain an XRD profile in a range of 2θ=20° to 70°. Specifically, an XRD profile was obtained using the Cu-Kα line at a voltage of 50 kV and a current of 300 mA. The degree of c-plane orientation was calculated by Lotgering's method. Specifically, the degree of c-plane orientation was calculated by the following equation. The degree of c-plane orientation of the alumina sintered body of Experimental Example 1 was 99.7%.

$$\text{Degree of } c\text{-Plane Orientation}[\%] = \frac{p - p_0}{1 - p_0} \times 100 \qquad [\text{Math. 2}]$$

$$p_0 = \frac{I_0(006)}{\sum I_0(hkl)}$$

$$p = \frac{I_s(006)}{\sum I_s(hkl)}$$

(2) Purity-1

The alumina sintered body was pulverized in an alumina mortar having a purity of 99.9% and was analyzed for the contents of elements other than Al and O by the following techniques. The total mass fraction (ppm) of impurity elements other than Mg and C in the alumina sintered body and the mass fractions (ppm) of Mg and C in the alumina sintered body were determined. The alumina sintered body of Experimental Example 1 contained no impurity element other than Mg and C (below the detection limit), and 114 ppm of Mg and 40 ppm of C were detected.

C and S: firing (high-frequency heating)-infrared absorption spectroscopy

N: inert gas fusion-thermal conductivity method

H: inert gas fusion-nondispersive infrared absorption spectroscopy

F: pyrohydrolysis-ion chromatography

Other elements (mainly Si, Fe, Ti, Na, Ca, Mg, K, P, V, Cr, Mn, Co, Ni, Cu, Zn, Y, Zr, Pb, Bi, Li, Be, B, Cl, Sc, Ga, Ge, As, Se, Br, Rb, Sr, Nb, Mo, Ru, Rh, Pd, Ag, Cd, In, Sn, Sb, Te, Cs, Ba, Hf, Ta, W, Ir, Pt, Au, Hg, La, Ce, Pr, Nd, Sm, Eu, Gd, Tb, Dy, Ho, Er, Tm, Yb, and Lu): ICP emission spectroscopy (3) Purity-2

The $Al_2O_3$ content (% by mass) of the alumina sintered body was calculated by determining the sum of the mass percentages of elements other than Al and O in the sintered body in (2) above, X, and subtracting X from 100. The $Al_2O_3$ content of the alumina sintered body of Experimental Example 1 was 99.98% by mass.

(4) Pore (Density)

Figure 7:
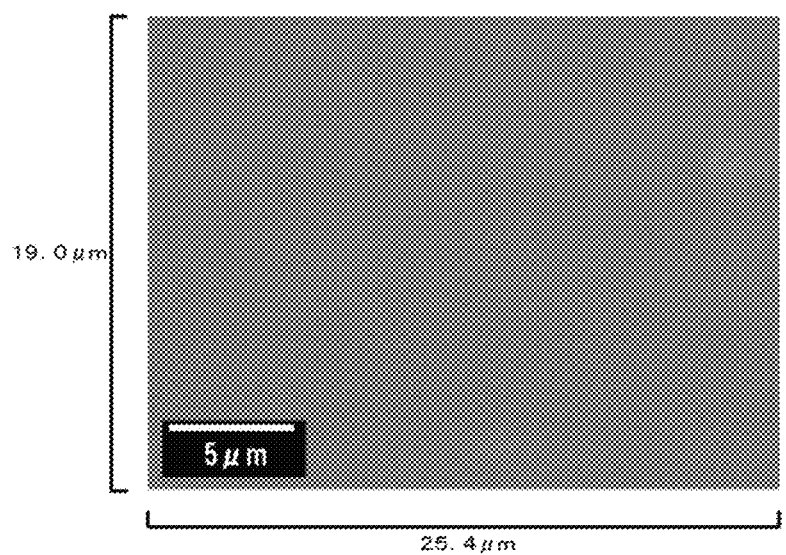
FIG. 7 is a high-magnification photograph of a polished cross-sectional surface of an alumina sintered body.
Figure 8:
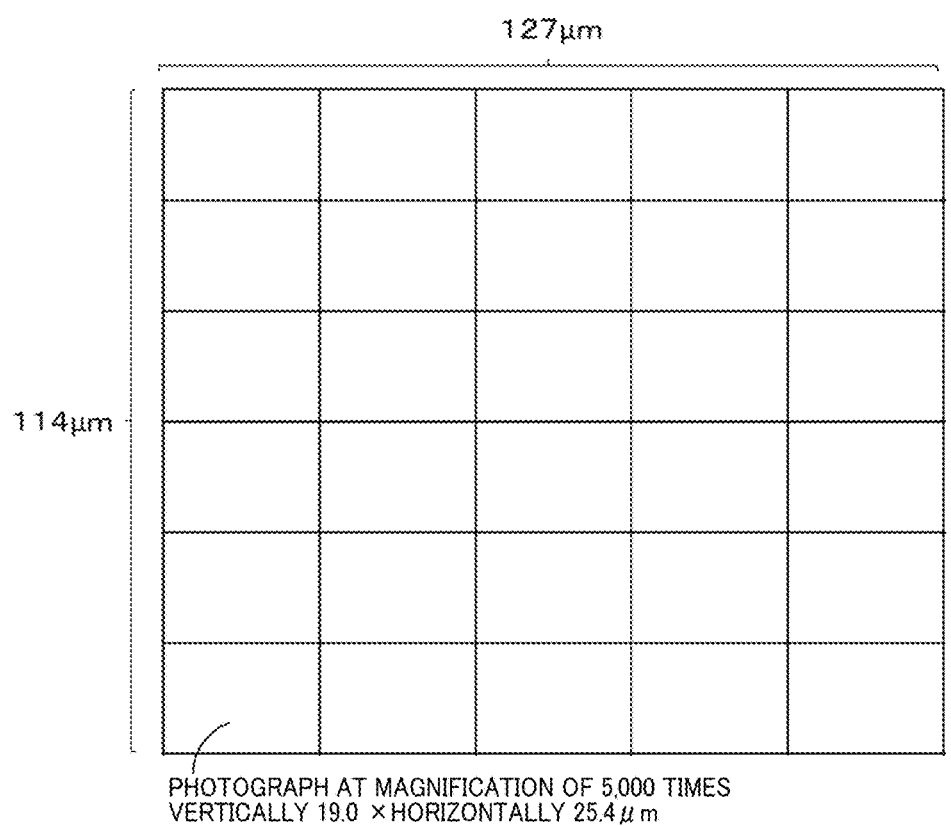
FIG. 8 is an illustration showing an arrangement of high-magnification photographs forming a continuous photograph.

Any cross-sectional surface of the resulting alumina sintered body was polished with a cross-section polisher (CP) (IB-09010CP available from JEOL Ltd.). CP belongs to the category of ion milling. CP was employed since it produces no particles detached from the polished surface. Photographs of the resulting cross-sectional surface were captured under a scanning electron microscope (JSM-6390 available from JEOL Ltd.). Specifically, vertically 6 photographs× horizontally 5 photographs with a field of view of vertically 19.0 μm×horizontally 25.4 μm were captured at a magnification of 5,000 times, as shown in FIG. 7, were arranged to form a continuous photograph (vertically 114 μm×horizontally 127 μm), as shown in FIG. 8, and were visually inspected to count pores. Pore areas and non-pore areas were easily visually discernible because of their clear contrast. No pores were observed in the alumina sintered body of Experimental Example 1.

(5) Particle Detachment

Figure 9:
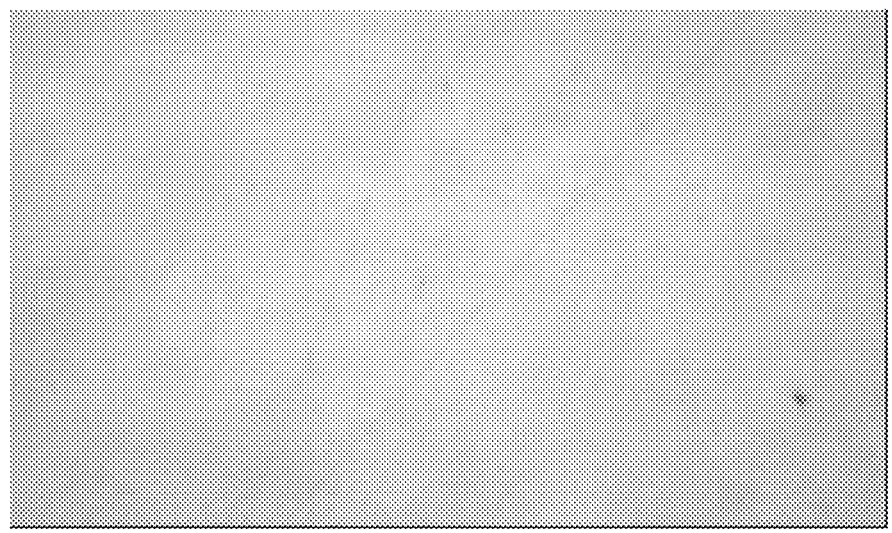
FIG. 9 is a photograph showing an example light micrograph of an alumina sintered body having a particle detached therefrom.

The resulting alumina sintered body was cut to a size of 10 mm×10 mm. Four cut compacts were fixed at intervals of 90° on the outermost periphery of a metal plate having a diameter of 68 mm and were lapped (pre-polished) with #800 SiC abrasive paper for 10 minutes and then with #1200 SiC abrasive paper for 5 minutes only under the weight of the metal plate and the lapping jig (a total of 1,314 g). The compacts were then lapped with diamond abrasives on a ceramic plate. Lapping was performed with an abrasive having a particle size of 1 μm for 30 minutes and then with an abrasive having a particle size of 0.5 μm for 2 hours. After the polished 10 mm×10 mm sintered bodies (specimens) were cleaned with acetone, ethanol, and ion exchange water in sequence, each for 3 minutes, randomly selected 20 areas were examined under a light microscope (MM-60 available from Nikon Corporation) at a magnification of 100 times to count detached particles. Of 20 specimens of the alumina sintered body of Experimental Example 1, no specimen had 10 or more areas where particles were detached (0/20). FIG. 9 shows an example light micrograph of an alumina sintered body having a particle detached therefrom.

(6) In-Line Transmittance

Of the 20 specimens of the resulting alumina sintered body, the specimen having the smallest number of detached particles observed under a light microscope was tested for in-line transmittance at wavelengths of 350 to 1,000 nm using a spectrophotometer (Lambda 900 available from Perkin Elmer Inc.). The in-line transmittance at wavelengths of 350 to 1,000 nm of the alumina sintered body of Experimental Example 1 was 76.2% or more.

(7) Na Flux Corrosion Resistance

The resulting alumina sintered body was tested for corrosion resistance to Na fluxes under conditions similar to those of actual GaN growth. The alumina sintered body was placed on the bottom of a flat-bottomed cylindrical alumina crucible having an inner diameter of 80 mm and a height of 45 am, and a melt composition was poured into the crucible in a glove box. The melt composition contained 60 g of metallic Ga, 60 g of metallic Na, and 1.85 g of germanium tetrachloride. After the alumina crucible was placed and sealed in a heat-resistant metal vessel, it was mounted on a rotating table of a crystal growth furnace. The solution was heated and pressurized to 870° C. and 4.0 MPa in a nitrogen atmosphere and was held for 120 hours while being rotated. The solution was then gradually cooled to room temperature over 3 hours, and the vessel was removed from the crystal growth furnace. After the surface of the alumina sintered bodies subjected to the corrosion resistance test was cleaned by sonication with ethanol, the in-line transmittance was determined as in (6) above. The in-line transmittance at wavelengths of 350 to 1,000 nm of the alumina sintered body of Experimental Example 1 after the corrosion resistance test was 72.6% or more.

TABLE 1

| | | | | | | | | In-line Transmittance before immersion (%) | In-line Transmittance after immersion (%) | Number of Sintered Body Having 10 or more Areas Where Particles Were Detached Therefrom |
|---|---|---|---|---|---|---|---|---|---|---|
| Experimental Examples | Degree of c-Plane Orientation (%) | Amount of Impurity[X] (ppm) | Mg Contents (ppm) | C contents (ppm) | $Al_2O_3$ Contents (% by mass) | Pore (number) | | | | |
| 1 | 99.7 | Not Contained | 114 | 40 | 99.98 | 0 | ≥76.2 | ≥72.6 | 0/20 |
| 2 | 92.2 | Not Contained | 113 | 40 | 99.98 | 0 | ≥80.3 | ≥78.1 | 1/20 |
| 3 | 90.1 | Not Contained | 111 | 40 | 99.98 | 0 | ≥71.5 | ≥67.3 | 0/20 |
| 4 | 91.4 | Not Contained | 113 | 40 | 99.98 | 0 | ≥70.9 | ≥67.6 | 0/20 |
| 5 | 90.6 | Not Contained | 113 | 30 | 99.99 | 0 | ≥71.2 | ≥68.0 | 2/20 |
| 6 | 99.1 | 95 | 117 | 40 | 99.97 | 0 | ≥70.4 | ≥65.5 | 0/20 |
| 7 | 99.1 | 219 | 118 | 40 | 99.96 | 54 | ≥25.6 | 0 | 0/20 |
| 8 | 99.5 | 890 | 121 | 40 | 99.89 | 0 | ≥1.1 | 0 | 0/20 |
| 9 | 70.7 | Not Contained | 113 | 40 | 99.98 | 98 | 0 | 0 | 1/20 |
| 10 | 30.7 | Not Contained | 114 | 20 | 99.99 | 172 | 0 | 0 | 7/20 |
| 11 | 98.9 | Not Contained | 113 | 30 | 99.99 | 0 | ≥76.9 | ≥72.7 | 1/20 |
| 12 | 99.5 | Not Contained | 1132 | 40 | 99.98 | 0 | ≥63.1 | 0 | 0/20 |
| 13 | 99.3 | Not Contained | 114 | 70 | 99.98 | 0 | ≥74.9 | ≥71.1 | 2/20 |
| 14 | 99.4 | Not Contained | 113 | 20 | 98.99 | 0 | ≥75.3 | ≥70.9 | 8/20 |
| 15 | 99.0 | Not Contained | 115 | 80 | 99.98 | 0 | ≥74.6 | ≥69.6 | 13/20 |

[X]The amount of impurity is determined as the sum of the contents of elements (other than Mg and O) determined by inductively coupled plasma (ICP) emission spectroscopy, firing (high-frequency heating)-infrared absorption spectroscopy, inert gas fusion-thermal conductivity method, inert gas fusion-nondispersive infrared absorption spectroscopy, and pyrohydrolysis-ion chromatography.

Experimental Example 2

An alumina sintered body was prepared as in Experimental Example 1 except that normal-pressure air firing followed by HIP firing was employed instead of hot pressing in the firing in 1.(3) of Experimental Example 1. Normal-pressure air firing was performed at 1,350° C. for 4 hours. HIP firing was performed at 1,800° C. under a pressure of 185 MPa using Ar as a pressure medium for 2 hours. The resulting alumina sintered body was tested for the properties in 2.(1) to 2.(7) above. The results are shown in Table 1.

Experimental Example 3

An alumina sintered body was prepared as in Experimental Example 1 except that 1.5 parts by mass of the plate-like alumina powder and 98.5 parts by mass of the fine granular alumina powder were used in the tape casting in 1.(2) of Experimental Example 1. The resulting alumina sintered body was tested for the properties in 2.(1) to 2.(7) above. The results are shown in Table 1.

Experimental Example 4

An alumina sintered body was prepared as in Experimental Example 1 except that the firing in 1.(3) of Experimental Example 1 was continued for 2 hours. The resulting alumina sintered body was tested for the properties in 2.(1) to 2.(7) above. The results are shown in Table 1.

Experimental Example 5

An alumina sintered body was prepared as in Experimental Example 1 except that the firing in 1.(3) of Experimental Example 1 was continued for 8 hours. The resulting alumina sintered body was tested for the properties in 2.(1) to 2.(7) above. The results are shown in Table 1.

Experimental Example 6

An alumina sintered body was prepared as in Experimental Example 1 except that, in addition to the magnesium oxide powder, 60 ppm by mass of a $SiO_2$ powder and 60 ppm by mass of a CaO powder were added as sintering aids to 100 parts by mass of the alumina powder mixture in the tape casting in 1.(2) of Experimental Example 1. The resulting alumina sintered body was tested for the properties in 2.(1) to 2.(7) above. The results are shown in Table 1.

Experimental Example 7

An alumina sintered body was prepared as in Experimental Example 1 except that, in addition to the magnesium oxide powder, 120 ppm by mass of a $SiO_2$ powder and 120 ppm by mass of a CaO powder were added as sintering aids to 100 parts by mass of the alumina powder mixture in the tape casting in 1.(2) of Experimental Example 1. The resulting alumina sintered body was tested for the properties in 2.(1) to 2.(7) above. The results are shown in Table 1.

Experimental Example 8

An alumina sintered body was prepared as in Experimental Example 1 except that a commercially available plate-like alumina powder (YFA10030, Kinsei Matec Co., Ltd.) was used instead of the plate-like alumina powder prepared in 1.(1) of Experimental Example 1. The resulting alumina sintered body was tested for the properties in 2.(1) to 2.(7) above. The results are shown in Table 1.

Experimental Example 9

An alumina sintered body was prepared as in Experimental Example 1 except that the firing in 1.(3) of Experimental Example 1 was performed at 1,700° C. The resulting alumina sintered body was tested for the properties in 2.(1) to 2.(7) above. The results are shown in Table 1.

Experimental Example 10

An alumina sintered body was prepared as in Experimental Example 1 except that the firing in 1.(3) of Experimental Example 1 was performed at 1,700° C. in air under normal pressure. The resulting alumina sintered body was tested for the properties in 2.(1) to 2.(7) above. The results are shown in Table 1.

Experimental Example 11

An alumina sintered body was prepared as in Experimental Example 1 except that the firing in 1.(3) of Experimental Example 1 was performed at 1,900° C. The resulting alumina sintered body was tested for the properties in 2.(1) to 2.(7) above. The results are shown in Table 1.

Experimental Example 12

An alumina sintered body was prepared as in Experimental Example 1 except that 0.25 part by mass of magnesium oxide was added to 100 parts by mass of the alumina powder mixture in the tape casting in 1.(2) of Experimental Example 1. The resulting alumina sintered body was tested for the properties in 2.(1) to 2.(7) above. The results are shown in Table 1.

Experimental Example 13

An alumina sintered body was prepared as in Experimental Example 1 except that 0.015 part by mass of a graphite powder was added to 100 parts by mass of the alumina powder mixture in the tape casting in 1.(2) of Experimental Example 1. The resulting alumina sintered body was tested for the properties in 2.(1) to 2.(7) above. The results are shown in Table 1.

Experimental Example 14

An alumina sintered body was prepared as in Experimental Example 1 except that 0.005 part by mass of a graphite powder was added to 100 parts by mass of the alumina powder mixture in the tape casting in 1.(2) of Experimental Example 1. The resulting alumina sintered body was tested for the properties in 2.(1) to 2.(7) above. The results are shown in Table 1.

Experimental Example 15

An alumina sintered body was prepared as in Experimental Example 1 except that 0.02 part by mass of a graphite powder was added to 100 parts by mass of the alumina powder mixture in the tape casting in 1.(2) of Experimental Example 1. The resulting alumina sintered body was tested for the properties in 2.(1) to 2.(7) above. The results are shown in Table 1.

[Evaluation]

The alumina sintered bodies of Experimental Examples 1 to 6 had degrees of c-plane orientation of 90% or more, had no pores, and had total contents of impurity elements other than Mg and C of 100 ppm or less. These alumina sintered bodies also had C contents of 30 to 70 ppm and Mg contents of 125 ppm or less and had in-line transmittances at 350 to 1,000 nm of 70% or more before immersion in a Na flux. The decrease in minimum in-line transmittance at 350 to 1,000 nm after immersion in a Na flux was 5% or less. Few detached particles were observed.

The alumina sintered body of Experimental Example 7 had a degree of c-plane orientation of 90% or more and had a C content of 30 to 70 ppm and a Mg content of 125 ppm or less. However, pores were observed, and the alumina sintered body had a total content of impurity elements other than Mg and C of more than 100 ppm and an in-line transmittance at 350 to 1,000 nm of 25.6% or more before immersion in a Na flux. This is probably because excessive amounts of $SiO_2$ and CaO were added.

The alumina sintered body of Experimental Example 8 had a degree of c-plane orientation of 90% or more, had a C content of 30 to 70 ppm and a Mg content of 125 ppm or less, and had no pores. However, this alumina sintered body had a total content of impurity elements other than Mg and C of more than 100 ppm and an in-line transmittance at 350 to 1,000 nm of 1.1% or more before immersion in a Na flux. This is probably because a commercially available plate-like alumina powder was used.

The alumina sintered bodies of Experimental Examples 9 and 10 had low degrees of c-plane orientation, i.e., 30.7% to 70.7%, and low in-line transmittances at 350 to 1,000 nm before immersion in a Na flux, i.e., 0%. This is probably because the firing after the tape casting was not performed at appropriate temperature.

The alumina sintered bodies of Experimental Examples 11 to 13 had degrees of c-plane orientation of 90% or more, had no pores, and contained no impurity elements other than Mg and C. These alumina sintered bodies also had C contents of 30 to 70 ppm and in-line transmittances at 350 to 1,000 nm of 60% or more (70% or more for Experimental Examples 11 and 13) before immersion in a Na flux, and few detached particles were observed. However, the alumina sintered body of Experimental Example 12 had an in-line transmittance at 350 to 1,000 nm of zero after immersion in a Na flux because of the high Mg content, i.e., 1,132 ppm.

The alumina sintered bodies of Experimental Examples 14 and 15 had degrees of c-plane orientation of 90% or more, had no pores, and contained no impurity elements other than Mg and C. These alumina sintered bodies also had Mg contents of 125 ppm or less and in-line transmittances of 70% or more before immersion in a Na flux. In addition, the decrease in in-line transmittance after immersion in a Na flux was 5% or less. However, relatively large numbers of detached particles were observed since their respective C contents were 20 ppm and 80 ppm.

Of Experimental Examples 1 to 15, Experimental Examples 1 to 6 and 11 to 15 correspond to examples of the present invention. These examples are not intended to limit the invention in any way; various embodiments are possible within the technical scope of the invention.

The present application claims priority from Japanese Patent Application No. 2014-241683 filed on Nov. 28, 2014, the entire contents of which are incorporated herein by reference.

What is claimed is:

1. An alumina sintered body having a surface with a degree of c-plane orientation of 90% or more as determined by Lotgering's method from an X-ray diffraction profile obtained by X-ray irradiation in a range of 2θ=20° to 70°,
having no pores when any cross-sectional surface is polished by ion milling and is examined under a scanning electron microscope at a magnification of 5,000 times,
having a total mass fraction of impurity elements other than Mg and C of 100 ppm or less, and
wherein the alumina sintered body contains 30 to 70 ppm by mass fraction of C.

2. The alumina sintered body according to claim 1, wherein a 0.2 mm thick specimen removed from the alumina sintered body has an in-line transmittance of 70% or more at wavelengths of 350 to 1,000 nm.

3. The alumina sintered body according to claim 1, containing 125 ppm or less by mass fraction of Mg.

4. The alumina sintered body according to claim 3, wherein a value obtained by subtracting the minimum in-line transmittance at wavelengths of 350 to 1,000 nm of a 0.2 mm thick specimen removed from the alumina sintered body after immersion in a Na flux at 870° C. under nitrogen for 120 hours from the minimum in-line transmittance at wavelengths of 350 to 1,000 nm of the 0.2 mm thick specimen removed from the alumina sintered body before the immersion in the Na flux is 5% or less.

5. A base substrate for an optical device, comprising the alumina sintered body according to claim 1.

6. A base substrate for an optical device, comprising the alumina sintered body according to claim 4.

* * * * *